(12) United States Patent
Gennett et al.

(10) Patent No.: US 7,361,430 B1
(45) Date of Patent: Apr. 22, 2008

(54) CARBON NANOTUBE-POLYMER COMPOSITE ACTUATORS

(75) Inventors: Thomas Gennett, Denver, CO (US); Ryne P. Raffaelle, Honeoye Falls, NY (US); Brian J. Landi, Rochester, NY (US); Michael J. Heben, Denver, CO (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 471 days.

(21) Appl. No.: 10/828,534

(22) Filed: Apr. 8, 2004

Related U.S. Application Data (60) Provisional application No. 60/461,607, filed on Apr. 8, 2003.

(51) Int. Cl.
*H01M 6/18* (2006.01)
*H01M 6/24* (2006.01)
*B05D 7/00* (2006.01)

(52) U.S. Cl. ............ 429/188; 310/300; 429/304; 427/217; 427/222; 977/725; 977/932

(58) Field of Classification Search .......... 310/300; 429/188, 304; 977/725, 932; 427/217, 222
See application file for complete search history.

(56) References Cited

U.S. PATENT DOCUMENTS

| 6,555,945 | B1 | 4/2003 | Baughman et al. |
| 6,756,795 | B2 * | 6/2004 | Hunt et al. ............... 324/701 |
| 6,833,201 | B2 * | 12/2004 | Czerw et al. ............. 428/690 |
| 7,160,530 | B2 * | 1/2007 | Dillon et al. ........... 423/447.1 |
| 2002/0096048 | A1 * | 7/2002 | Cooper et al. ............ 95/116 |
| 2006/0240238 | A1 * | 10/2006 | Boussaad et al. ...... 428/293.4 |
| 2006/0257645 | A1 * | 11/2006 | Asaka et al. ............. 428/323 |
| 2006/0266981 | A1 * | 11/2006 | Asaka et al. ............. 252/500 |

OTHER PUBLICATIONS

B.J. Landi et al. Development and characterization of single wall carbon nanotube -Nafion composite actuators. *Mat. Sci. Eng* B 116 (2005) 359-362.
Brian J. Landi et al. Single Wall Carbon Nanotube-Nafion Composite Actuators. *Nano Letters* (2002) vol. 2, No. 11, 1329-1332.

* cited by examiner

*Primary Examiner*—H. T Le
(74) *Attorney, Agent, or Firm*—Brian J. Lally; Michael J. Dobbs; Paul A. Gottlieb (57) ABSTRACT

The present invention discloses a carbon nanotube (SWNT)-polymer composite actuator and method to make such actuator. A series of uniform composites was prepared by dispersing purified single wall nanotubes with varying weight percents into a polymer matrix, followed by solution casting. The resulting nanotube-polymer composite was then successfully used to form a nanotube polymer actuator.

21 Claims, 10 Drawing Sheets

Figure 10

CARBON NANOTUBE-POLYMER COMPOSITE ACTUATORS

RELATION TO OTHER APPLICATIONS

The present application is related to, and seek priority of, U.S. Provisional Application No. 60/461,607, entitled "Carbon Nanotube-Polymer Composite Actuators," filed Apr. 8, 2003, by instant inventors and which is hereby incorporated by reference in its entirety.

U.S. GOVERNMENT RIGHTS

The United States Government has rights in this invention pursuant to Contract No. NREL-KDJ-0-30625-01 between the U.S. Department of Energy and the Rochester Institute of Technology.

TECHNICAL FIELD

The present invention relates to a novel electro-chemical actuator and method of making such actuators. More specifically, the present invention relates to carbon nanotube-polymer composite actuator.

BACKGROUND OF THE INVENTION

The development of electrochemical sensors and actuators has been a recent area of study, with preliminary advancements in artificial muscle and micro-electromechanical systems (MEMS) technologies. An electrochemical actuator is defined as a device that converts synergistic electrical and chemical processes to produce a mechanical response. The mechanical response typically resembles a bending or flexing of the actuating material, resulting from the electrochemical excitation.$_{(1)}$ These devices have potential applications in medicinal procedures like arterial bypass surgery, where delicate catheter insertion and manipulation is critical to success.

Other developments for medicine may come from microactuators being applied to artificial muscle research. Another field that is optimistic for actuator development is optics, where microactuators may be employed for positioning of mirrors or lenses. Additionally, it has been proposed that aircraft will be constructed with "microflaps" that improve drag properties for enhanced landing.$_{(2)}$ Applications to MEMs and the new proposed NEMs devices are also quite significant. Regardless of the many scientific applications for actuators/microactuators, it is imperative for researchers to evaluate and characterize the necessary properties that allow for successful technological integration.

Studies designed to evaluate actuation properties specific to conducting polymers, carbon nanotubes, and ion-exchange polymer metallic composites (IPMCs) have been reported by many groups in the literature.$_{(2-6)}$ The most prominent conducting polymers are polypyrrole$_{(3-4)}$ and polyacetylene.$_2$ Controlled variations of redox reactions on the polymer backbone account for the observed actuation.$_{(2-4)}$ Work done by Baughman et. al., has initiated the analysis of carbon nanotubes as actuating devices, operating via a non-Faradaic mechanism.$_{(5)}$ Another very popular area for thin film polymeric actuators has been the analysis of metal-doped perfluorocarbonsulfonic acid ionomer actuators (usually NAFION®, produced by ALRDICH, Milwaukee, Wis.), which function via ion intercalation and osmotic effects.$_{(6)}$ Although each of these systems operates under different conditions and mechanisms, the overall goal is to produce a highly efficient actuator for device application.

Electrochemical Actuators

Construction of electrochemical actuators consists of three components: anode, cathode, and electrolyte. Ionic species are transported through the electrolyte to establish electric double layers, producing non-faradaic processes. The charge transfer initiates dimensional changes in the actuator electrodes, producing axial strain (Length/Length), and a corresponding macroscopic deflection. Electrochemical actuators are different than other actuator types like electrostatic and piezoelectric, since an applied voltage stimulates the operation rather than an electric field. This provides a significant advantage for electrochemical actuators since only a few volts and small currents are needed to produce work responses that are an order of magnitude greater than electrostatic or piezoelectric ones.$_{(2)}$ Electrochemical actuators satisfy many of the ideal properties necessary for development of artificial muscle or for utilization in MEMS devices, but currently many such systems contain several disadvantages. Shahinpoor highlights several key factors which are required for micromanipulation: (1) flexible material, (2) long cycle life, and (3) fast, simple reaction mechanism.$_{(7)}$ More specifically, actuator electrodes should be thin, with minimal inner electrode separation, to promote higher rates of diffusion for ionic intercalation. Also, surface effects should minimize electrode resistance to enhance electrical stimulus. Electrolyte selection requires ionic species, which have high mobility to maintain fast transfer rates between electrodes in the faradaic actuators. Baughman has cited these characteristics as dominating factors in the large work per cycle and force values obtained for conducting polymer actuators and polymeric gel actuators, respectively.$_{(5)}$ While electrochemical actuators exemplify many key features, there are several limitations that require attention. Most importantly is the necessity of an electrolyte solution, discouraging any attempts for solid-state structures. Some attempts however, are being directed towards use of a solid electrolyte, like hydrated poly(vinyl alcohol)/$H_3PO_4$.$_{(2)}$ A second observed shortcoming is the limited cycle life of the electrochemical actuators largely attributed to the doping/de-doping effects of ion intercalation for faradaic actuators.$_{(2)}$ A major disadvantage shown for IPMC actuators is delamination of the surface metal coating such as gold on polypyrrole$_{(2)}$ or platinum on poly(acrylonitrile)$_{(8)}$ that is required for actuation at high voltages. While these characteristics outline important guidelines for actuator development, consideration of several types, namely conducting polymer, gel fiber and ionic conducting polymers (ionomers), can in turn provide further understanding.

Substantial work has been done to evaluate the electrochemical properties of gel, conducting polymer, and IPMC systems. Polyelectrolyte gels are unique in that under an electric field, they swell in volume inducing a mechanical change. A recent report using poly(acrylonitrile) (PAN) gel fibers exhibited swelling when exposed to alkaline media and contraction during acidic conditions. These gel fibers coated with platinum or intermixed with high doping of graphite fibers, produced an approximately 40-50% elongation after 10 minutes of electrical activation.$_{(8)}$ These values are considerably higher than polythiophene, which was shown to expand by only 2% after 20 minutes.$_9$ Although the PAN gel systems produced considerable strain, slow reaction times and high voltages (10-20 V excitation) display inferior properties to other actuator systems.[8] Better performance systems have been observed with conducting polymers like polypyrrole[3,4] and polyacetylene.[2] These conducting polymers operate through redox reactions, causing length changes in the carbon-carbon bonds on the polymer backbone. Electrolyte and charge density effects have also been cited as potential mechanistic factors for conducting polymer actuators.[3] Film expansion values for these films have been reported to equal 3% for polypyrrole[4] at neutral pH and 1.6% for alkali-doped polyacetylene films. While the ionic dopant species has been shown to be a critical parameter during actuation, solvent effects are reported to be just as significant. Osmotic effects have been proposed to significantly alter the degree of actuation in conducting polymers by increasing film expansion upon decreased electrolyte concentration. Bay et. al., attribute this result to the influx of water into the polymer films from the high ionic strength of the doped polymer matrix.[3] Our results with the nanotube composite actuators supports the significance of the internal electrochemical reactions at the polymer backbone and shows that normalization of electrolyte concentrations is critical for comparison of different conducting polymer systems.[3]

While attempts to develop actuators using conducting and gel polymers have been realized, increased response rates, higher cantilever deflection limits, and lower operating voltages have been characteristically shown for the ionic polymer NAFION®. The perfluorinated ionomeric polymer, NAFION® has been shown to actuate under electrical stimulus in an electrolyte solution when doped with large >40% w/w amounts of platinum. The prominent structural model for NAFION® considers a hydrophobic region with the fluorocarbon backbone and interstitial channels with ionic clusters that contain sulfonate groups. The micellular-like ionic clusters have sulfonate groups with bound $H_2O$ and counter ions, usually H+ or Na+. While the interstitial channels have some $H_2O$ present, mostly it is void volume. Variations in morphology for these locations, the ionic clusters and interstitial channels, is directly affected by the cation charge bound to the sulfonate. Hence movement of ions within the polymer can alter the void volumes, and by design cause a constriction/expansion of the polymer—that can be characterized as actuation.

Actuation using NAFION® in aqueous electrolytes has been performed upon surface metal doping, typically platinum or gold, at concentrations >3 mg/cm$_2$.[58] Abe et. al., first showed the effects of counter cation species in the electrolyte, concluding that Li+ produced the largest displacement, ~1 mm towards the anode.[6] The mechanism provided for this electrochemical actuation supports the bending and relaxation processes observed. Upon electrical excitation (a few volts or less), the hydrated counter cation moves to the cathode side of the electrode, swelling the composite with water, and inducing a bend in the film towards the anode. After prolonged electrical excitation of the film, there is an observed relaxation or creeping process back towards the cathode side. Osmotic effects have been cited as the source of this occurrence. Therefore, the presence of water has an astounding impact on the overall mechanism.[6]

Improvements to the actuation process, namely enhanced load capability, larger displacements, and surface modifications, have been the focus of recent work.[11,12] Film thickness effects on load capability have shown that doubling the thickness for each NAFION® film corresponds to an 8-fold increase in force generated.[11] While commercially available films are ~200 μm, Shahinpoor et. al., have developed a procedure to produce 2 mm thick NAFION® films.[11] Another group has evaluated the metal doping characteristics of NAFION® films by roughening the surface to increase surface area sufficient to enhance platinization for an observed 50% increase in displacement.[12] While platinum has been the traditional metal to dope NAFION®, other reports have investigated effects of gold,[13,14] and copper-platinum,[15] as superior dopants. Although the surface effects have been studied in considerable detail, significant effort has also been made towards understanding the $H_2O$ and ionic conductivity effects within the NAFION® matrix. NAFION® has been shown to have both bound and non-bound water present, with the amounts and ratios varying with the type of counter cation present. The ability to hydrate the counter cation, especially as it migrates during electrochemical actuation, is a property distinct to each cation. Electrolytes with lithium cations have been shown to exhibit the best actuation properties. This can be attributed to the high ionic conductivity[16] and large hydration spheres observed for Li+ in the NAFION® matrix.[6] Although promising results have been shown for NAFION®-based actuators, the necessity to have ion intercalation at the cathode introduces a time deficiency for migration, similar to the gel and conducting polymer systems.

Carbon Nanotube Actuators

Demonstration of carbon nanotube actuators in 1999 by Baughman et. al., displayed a novel material for conversion of electrical energy into mechanical energy. Preliminary results predicted the highest work capacity of known actuating materials.[5] The single wall carbon nanotube devices were constructed using strips of "buckey paper" sheets assembled from as-produced laser generated material. Each strip was placed on opposite sides of an insulating piece of double-stick tape and the carbon nanotube electrodes were connected to clamped platinum electrical leads.

The device was inserted in a 1M NaCl solution and several volts were applied, producing deflection at the cantilever tip up to about a centimeter. Further characterization showed that the bimorph cantilever actuator produces strain results which are >0.2%. This value already exceeds the highest strain value of ~0.1% known for ferroelectric ceramics. Theoretical predictions indicate that carbon nanotube actuators can potentially reach strain values of ~1% when the carbon nanotubes exist as individual single walled nanotubes ("SWNTs), i.e. not bundled. The initial work showed surface area measurements using the Brunauer-Emmett-Teller (BET) method of the buckeypapers to be ~300 m$_2$/g, whereas individual SWNTs are predicted to have values of ~1600 m$_2$/g.[5] This correlates with the five-fold decrease of observed strain versus the theoretical value based on surface area assignments. A result that is explained by only the exterior SWNTs in the bundles participating in the actuation highlighting an important observation to support the mechanism for actuation. It was concluded that the actuation in carbon nanotubes is caused by charge injection from the electrolyte salt present in solution, promoting an electric double layer.[5]

In turn, the charge induces quantum mechanical expansion of the covalent framework of the carbon nanotubes, producing an observed strain. Therefore, a larger degree of actuation was proposed for debundled SWNTs, resulting from an increased surface area, thereby enhancing electric double layer effects. Overall, the initial study by Baughman et. al., has displayed the extreme potential for carbon nanotube actuators and provides a preliminary understanding of the mechanism which supports this technology.[5]

There have been a number of recent reports describing potential applications of carbon nanotube actuators. An example is the pneumatic response for carbon nanotube buckey papers due to gas formation between carbon nanotube layers, also shown by Baughman et. al.[17] Results indicate >2% contraction of the carbon nanotube sheets when exposed to a 5M NaCl solution and voltages between +0.5 and +1.5 V. Although these results are impressive, the requirement to develop consistent carbon nanotube paper layers to form reproducible pneumatic actuators with long life cycles is limiting.[17] Other attempts to study the actuation properties of individual SWNTs has been fraught with difficulties, although some success has been achieved growing carbon nanotubes across pre-trenched wafers using the CVD process, and monitoring potential actuation using an Atomic Force Microscopy (AFM) tip.[18] Additional attempts are being made to develop "nanotweezers," where individual SWNTs bound to an AFM tip under an applied dc voltage cause the two carbon nanotubes to approach each other. Such techniques may be applicable to the development of manipulating structures for nanoelectronics.[19]

Each type of carbon nanotube, single wall or multi-wall, exhibits unique and useful properties for both basic science and applied technology. Although SWNTs are the focus of this invention, multi-wall carbon nanotubes (MWNTs) are also easily applied to the system Carbon Nanotube-Polymer Composites A new area of research is concentrating on developing carbon nanotube-polymer composites. The goal is to develop novel materials exhibiting unique electrical, thermal, optical, and mechanical properties. Some research has been devoted to developing composites that successfully transfer load requirements from the polymer backbone to the dispersed carbon nanotubes. Ideal for such applications, carbon nanotubes exhibit a large aspect ratio, which is conducive to formation of a network within the polymer matrix. The established network at high doping levels can lead to a percolation threshold, which is proportional to the aspect ratio, ~$10_3$ for SWNTs.[20] Since the tensile strength of carbon nanotubes has been predicted to be 10-100 times that of steel, SWNT polymer composites could significantly enhance the strength of composite materials. Initial studies focused on MWNT-polystyrene composites for load transfer effects, concluding that 1% w/w dispersions significantly increased the elastic modulus and break stresses of the resulting composites by ~40% and ~25%, respectively.[21] Although the results are encouraging, the carbon nanotube material used in the above study[21] was as-produced MWNTs, containing metal catalyst impurities and numerous structural defects. This preliminary work has perpetuated more in depth analyses, including the recent proposal that SWNTs present superior load transfer abilities over MWNTs, since the polymer chain is interacting directly with the outermost shell responsible for carrying the imposed load.[22] When using MWNTs, the internal shells are free to move and are only stabilized by weak Van der Waal's forces, thereby allowing eventual deterioration of composite strength. However, to develop successful composites using SWNTs, researchers have proposed the necessity to overcome the bundling effects exhibited by SWNTs. Ajayan et. al., have calculated the force required to separate SWNTs individually from the bundles. Results indicate that energetically it would be easier for a polymeric matrix to pull a SWNT from the end of the bundle, rather than normal to the bundle, overcoming the carbon nanotube's Van der Waal's interactions for the bundle. Depending on the interfacial strength between the carbon nanotube and polymer matrix, this force normal to the bundle may result in shearing of the SWNT, specifically at defective sites along the sidewall of the carbon nanotube.[23]

While load transfer composites represent one area for carbon nanotube-polymer composite applications, another significant approach utilizes the high thermal conductivity of carbon nanotubes. Since thermal transport in solid structures results from a combination of conduction by electrons and phonons, successful interaction between polymer matrices and carbon nanotubes can be used for thermal management. Since theoretical predictions for thermal conductivity in SWNTs equal 6000 W/mK,[20] the integration of SWNTs into polymer composites shows extreme potential for these applications. A recent report has shown a 125% increase in thermal conductivity for a 1% w/w as-produced SWNT-poxy composite.[20] In addition, molecular modeling has provided certain theoretical insights to help support the observed carbon nanotube polymer interactions. Gong et. al., have reported an increase in $T_g$ of 25° C., and an elastic modulus increase of 30% for epoxy composites with 1% w/w doping of carbon nanotubes.[24]

Carbon nanotube-polyethylene composites have exhibited a higher glass transition temperature, $T_g$, than the native polyethylene. These results have shown an increase in thermal expansion coefficients for composite systems, explained by the rigidity of dispersed carbon nanotubes with uniform phonon vibrations, preventing polymer rearrangement at higher temperatures.[25] A similar report using carbon nanotube-polystyrene composites shows enhanced interaction between polymer and carbon nanotubes due to a thermal expansion coefficient mismatch, which is proposed to increase the interlocking mechanism when composites are cooled from their melt.[57] A need exists for the integration of carbon nanotubes with polymer matrices.

Carbon Nanotube-Polymer Composite Actuators

Successful integration of high purity SWNTs with a polymer matrix to develop novel devices is at the forefront of many research groups. Introduction of highly conductive SWNTs into the NAFION® polymer could significantly enhance the polymer film conduction, the composite tensile strength and thermal stability, which may improve the conditions for actuation.

SUMMARY OF THE INVENTION

An object of the present invention is to provide a carbon nanotube-polymer composite capable of being used as an actuator;

Another object of the present invention is to provide a carbon nanotube-polymer composite actuator that overcomes the problems associated with the prior art;

Yet another object of the present invention is to provide a carbon nanotube polymer composite actuator incorporating SWNTs;

Yet another object of the present invention is to provide a carbon nanotube polymer composite actuator incorporating MWNTs;

Another aspect of the present invention is to describe the following as carbon nanotube composites, which could be multi, single wall, nanohorns, or other high aspect ratio nanostructured carbon, boron nitride, silicon carbide, etc. materials Another object of the present invention is to provide a carbon-nanotube polymer composite actuator with increased rate of conversion, higher efficiency of conversion, and longer life cycle compared with prior art composite actuators;

Another object of the present invention is to provide a carbon-nano-tube polymer composite with superior thermal conductivity;

An aspect of the present invention is the use of metal-doped perfluorocarbonsulfonic acid based ionomer actuators, preferably NAFION®, produced by ALRDICH, Milwaukee, Wis.

Another aspect of the present invention is to use other ionomer polymeric materials doped with carbon nanotubes to construct an actuator.

Another aspect of the present invention is to use ionically conductive polymers-nanotube composites as actuators Another aspect of the present invention is to utilize "smart gels" carbon nanotube composite systems as actuators.

Another aspect of the present invention is to utilize other polymer systems that have been doped with carbon nanotubes as actuators systems.

The present invention discloses a carbon nanotube (SWNT)-polymer composite actuator and method to make such actuator. A series of uniform composites was prepared by dispersing single wall nanotubes with varying weight percents into a NAFION® polymer matrix, followed by solution casting. The resulting nanotube-polymer composite was then used to form a nanotube polymer actuator system.

DETAILED DESCRIPTION OF THE EMBODIMENTS

The present invention relates to a novel carbon nanotube-polymer composite capable of being used an electrochemical actuator. The carbon nanotube-polymer composite can be synthesized by a number of techniques known in the art including but not limited to: electro spinning, melt polymerization extrusion, solution processing, co-polymerization, etc.

One preferred method for preparing the present invention generally comprises the following:
1. Mixing carbon nanotubes ("SWNT's") with a polymer solution to form a SWNT-polymer solution;
2. (preferable) Homogenizing the SWNT-polymer solution;
3. (preferable) Exposing the SWNT-polymer solution to high shear stirring;
4. (preferable) Centrifuging the SWNT-polymer solution;
5. (preferable) Casting the SWNT-polymer solution to form a composite film or fiber;
6. (preferable) Stabilization the cast SWNT-polymer composite;
7. Drying to SWNT-polymer composite.

Steps 2-5 are optional and are intended to provide the user with a solution capable of being cast as an extremely thin film. When producing thin films such steps may prove necessary. The desirability of implementing optional step(s) will depend on the desired finished composite and its intended use.

Figure 2:
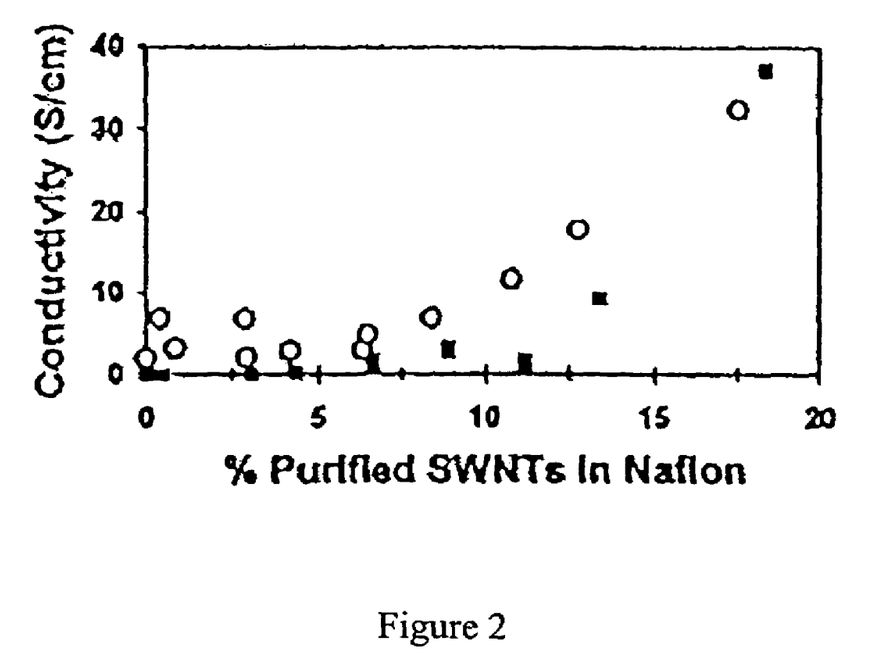
FIG. 2. Illustrates the conductivity for various percent by weight h-SWNT-NAFION® composites ares shown. The filled boxes represent the as-cast SWNT-composite membranes and the open circles the platinized SWNT-NAFION® composite membranes. Measurements were conducted using a standard four-point resistivity probe.

A Preferred Procedure for Preparing Single Wall Carbon Nanotube-Polymer Composites Composites of NAFION® and nanotube materials (NT's) were prepared by the dispersion of the NTs in a 5% w/w NAFION®-1100 2-propanol solution (Aldrich). The appropriate amounts of purified or, impure, NTs were added to the NAFION®-2-propanol solutions in order to achieve between 0.1 and 18% w/w nanotube loadings within the final polymer membrane. The weight percent is calculated based on the amount of nanotubes that are present in the mass of the composite. (Mass nanotubes/mass composite)×100. The NT-NAFION® solutions were first homogenized by stirring for five 10-minute intervals at 20,000 rpm until a highly homogeneous solution resulted. The solutions were then exposed to high shear stirring at room temperature for 72 h. After 72 h, the solutions were centrifuged (600 rpms for 2 minutes) to remove any nondispersed materials. After centrifugation, the mass of any residue was determined and the percent by weight was adjusted accordingly (mass of NT material removed was subtracted from the original amount). Using traditional solution-casting techniques, thin film membranes of 25 µm thickness were cast onto a BYTAC® (Saint-Gobain, Les Miroirs, France) substrate. After stabilizing for 24 h in air, the membranes were dried in vacuo (100 mTorr) at 70° C. for 30 min. The resultant membranes were then easily removed from the casting plate. The relationship between a set of experiments that illustrate SWNT doping level and composite conductivity is shown in FIG. 2. Details on metal doping are discussed later.

Figure 3:
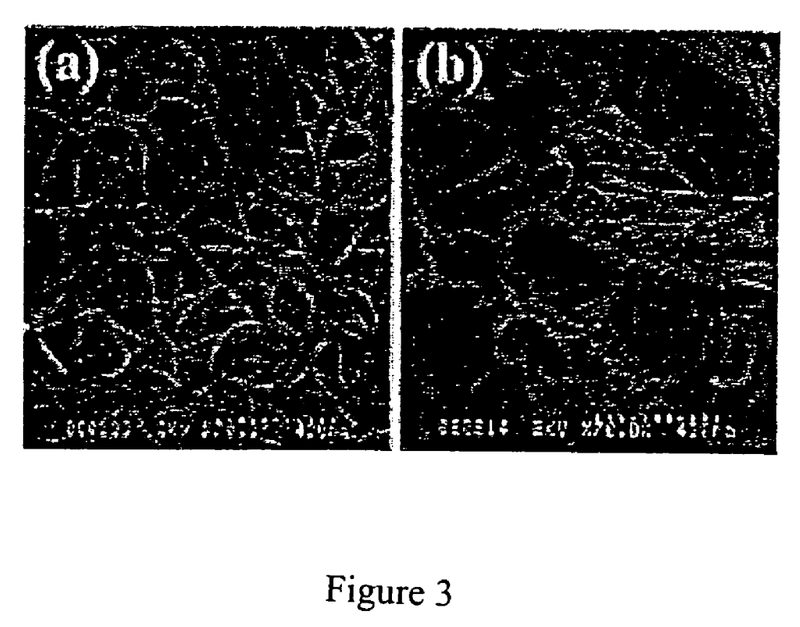
FIG. 3 shows FESEM images depicting a 5-fold reduction in h-SWNT bundle diameter from (a) high purity, compared to (b) 10% w/w/dispersion in NAFION®.
Figure 4:
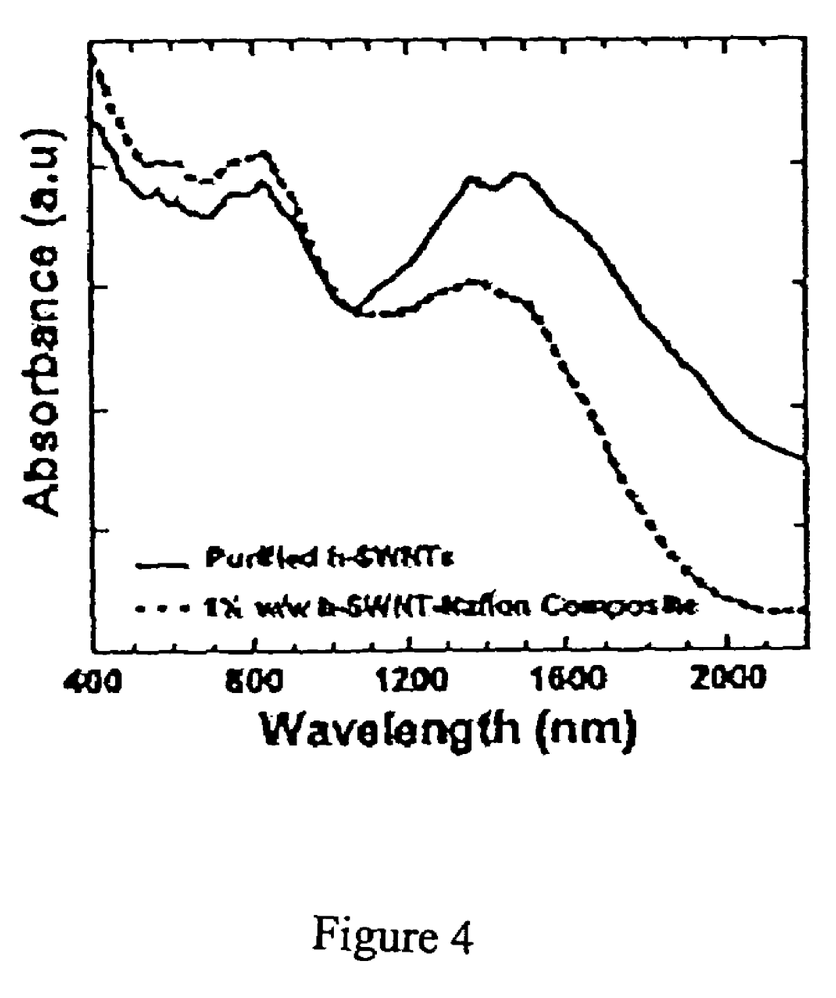
FIG. 4. Is an overlay of the optical spectroscopy spectra fro purified h-SWNTs and 1% w/w h-SWNT-NAFION® composite m with a 900 UV-vis-NIR spectrometer. Spectra were normalized at 1025 nm. A quench of the first van Hove singulatirty absorption intensity for the semiconducting SWNTs within the composite is evident at ~1450 nm.

Interestingly, FESEM analyses indicate a factor of 5 reduction in bundle size for a 10% w/w SWNT-NAFION® composite, correlating to a factor of 25 reduction in number of SWNTs per bundle as shown in FIG. 3. In a random sampling of 25 different bundles within a single image, the average bundle size for the purified material was 56 nm.$_{(28)}$, while the average bundle size of the SWNTs within the polymer matrix was 11 nm. This "debundling" is advantageous for an increased homogeneous distribution of the SWNTs throughout the NAFION® matrix and improves the percolation thresholds for electronic and thermal conductivity associated with the composite. The extent of bundle size reduction will directly improve the membrane conductivity for the same mass dopings. Interestingly, FIG. 4 illustrates the effect that polymer encapsulation also has on the optical spectroscopy response of the SWNTs. It is quite clear that the intensity of the first van Hove singularity is drastically reduced. Whether this is a debundling, polymer encapsulation, and/or charge transfer effect is not clear at this time.

SWNT-Polymer Solution

The above embodiment describes a SWNT-polymer solution prepared by mixing purified SWNTs with a 5% w/w NAFION®-1100 2-propanol solution. Although NAFION® is the preferred polymer other polymers may also be employed the range of polymers would include but not be limited to ionomers, polyelectrolytes, smart gels, aerogels, co-polymes, block polymers, straight chain polymers, protein composites, etc. It should also be noted the constituents of the solution can be added in different steps.

Propanol was utilized in the present invention because NAFION® is soluble in alcohol solutions, however, if a different polymer is used the solvent may be changed to ensure polymer solubility. The percent weight of polymer to solvent can also vary.

Homogenization

The preferred embodiment describes a homogenization process comprising: five 10-minute mixing intervals at 20,000 rpm using an Ultra TURRAX® T25 purchased from (IKA-Werk, Staufen, Germany), however, other mixers and homogenization techniques known in the art could also be employed. The mixing speed and mixing time can also be varied.

High Shear Stirring

The above embodiment calls for high shear stirring (2,000 rpm) at room temperature for 72 h, however, a range of temperatures, stirring speeds and time periods can also be employed.

Centrifugation

Centrifugation was employed in to remove any undispersed materials. Centrifugation speeds and times can be varied.

Casting Onto a Substrate

The above embodiment call for casting upon a BYTAC® substrate, however, other substrates can also be employed.

Drying

Drying of the composite can be accomplished by a number of techniques known in the art including but not limited to: heating and vacuum heating.

Preparation of Metal-Doped SWNT-Polymer Composites

Figure 1:
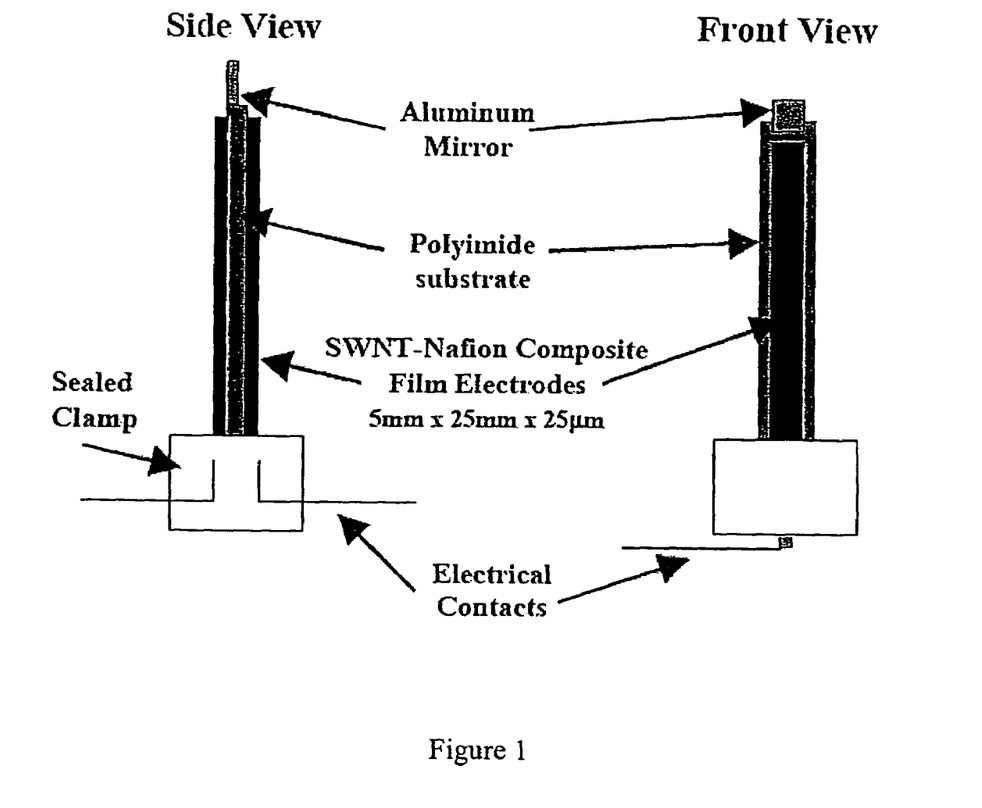
FIG. 1. Is a schematic for the fabrication of bimorph cantilever actuators. SWNT-Nafion Composite thin film electrodes were applied to each side of a polyimide substrate; electrical contacts were applied with a sealed clamp.

The composite can be doped with a variety of metals including but not limited to: platinum, copper, gold and combinations thereof. This metallization can be accomplished by a variety of techniques such as, but not limited to: electroless deposition, electrochemical reduction or oxidation, evaporation, sputtering, etc. Various doping techniques can be employed including the following platinization process is an example, but is not presented to be the only process technique available. The platinization of the composite films was achieved by first immersing the composite membrane into a 4 mM tetraamine Pt(II)Cl2 solution.$_{(29)}$ The membrane was removed, washed, and reimmersed into a 0.1 M NaBH4 3:1 (distilled water/methanol) solution to reduce the Pt(II) to Pt(0). The anionic nature of the composite membrane and the kinetic control of the experiment limited the depth of penetration of the borohydride anion. After chemical reduction of Pt(II) to Pt(0), the membrane was thrice immersed for 1 h in 0.3 M HClO4 acid solution. These washes removed residual Pt-(II) ions and reconverted the NAFION® membrane to the protonated form. This platinization process reproducibly resulted in a platinum penetration depth into the membrane on the order of 0.1 microns as determined by FESEM. The resistivity of the films was a consistent 0.1 ohmâcm for platinized NAFION® composites. Even though the nanotube doped membranes with >5% w/w SWNTs resulted in films with high conductivity, they were platinized in order to maintain consistency in the experimental measurements. The metal doping level will range depending on the applications and needs associated with the nt-polymer composite actuator system, from 0-50% w/w. For example: one might not even need a metal incorporation if the composite conductivity has increased because of the nt-doping. As mentioned earlier, de-bundling of the nanotubes will alter the level of metallization needed Preparation of Carbon Nano-Tube-Polymer Composite Bimorph Actuator Bimorph cantilever actuators can be prepared similarly to those reported elsewhere by Baughman et. al.,$_{(5)}$ by placing two electrodes on each side of an insulating substrate. Strips of the platinized SWNT-NAFION® composites were cut in dimensions of 5 mm×25 mm and applied to each side of a polyimide insulator using GE Varnish. The composite films dried for 4-6 hours on the polyimide substrate a room temperature. Platinum wire electrical leads were placed at one end of the polyimide insulator with a Teflon clamp (VWR) pressing contacts between electrodes and wires. The clamp's joint was sealed using GE Silicone II and the actuator was allowed to cure overnight at room temperature. During deflection analysis, a reflective mirror was necessary on the tip of the actuator. A thermal deposition of aluminum onto Kapton tape provided the reflective surface and samples were cut into dimensions of 3.5 mm×5 mm and applied to the actuator tip. The overall SWNT-NAFION® composite film electrode design and setup is depicted in FIG. 1.

Synthesis and Purification of SWNT

The SWNTs used in this study were purchased from Carbon Nanotechnologies, Inc., (Houston, Tex.), HiPco or h-SWNTs or produced via laser abalation. This is not intended to indicate that these are the only materials in the design, all nanostructured fibraous materials from various synthetic routes are applicable to this system. The h-SWNTs were purified according to the procedure established by Chiang et al.[30]. In summary, ~50 mg of as purchased ("AP") AP h-SWNTs were heated to 225° C. in air for 16 hours, followed by ultrasonication in ~20 mL concentrated hydrochloric acid for one hour. The solution was filtered through a 0.2 mm-47 mm Anodisc membrane filter and dried at 70° C. in vacuo for one hour. The procedure was repeated at temperatures of 325 and 425° C. in air for two hours, with ultrasonication in concentrated hydrochloric acid for similar times. A final thermal oxidation at 425° C. for two hours was performed to attain >95% w/w h-SWNTs, the desired purity.

Figure 5:
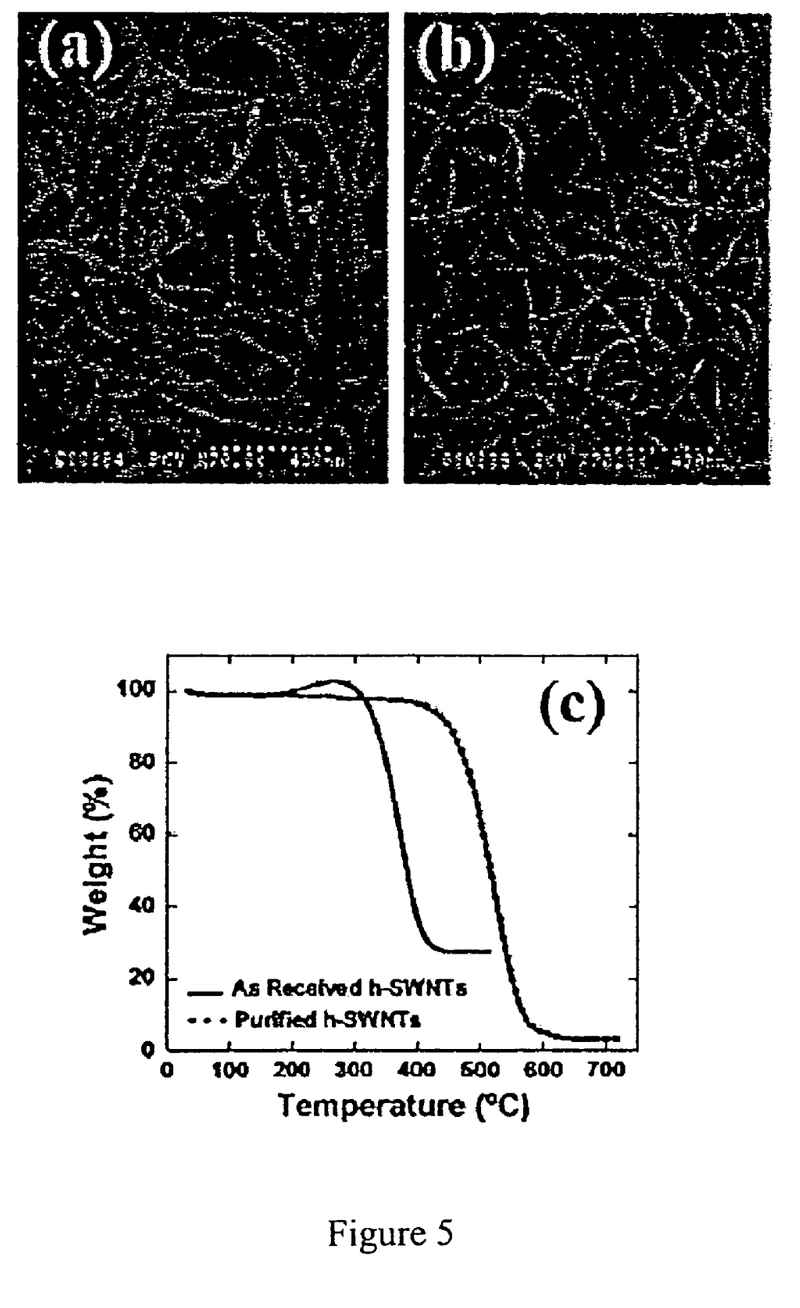
FIG. 5. Illustrates analysis of h-SWNTs: (a) Hitachi model S-900 FESEM image of as-received material from Carbon Nanotechnologies Inc., the carbonaceous coating is clearly evident; (b) FESEM image of high purity, >95% w/w, h-SWNTs after purification; (c) TA Instruments model 2950 thermogram overlay displaying the decomposition of as-received and purified h-SWNT samples, 5 C/min under 60 sccm flowing air atmosphere.

The purity of the final SWNT samples was determined quantitatively using thermogravimetric analysis (TGA) in conjunction with inductively coupled plasma spectroscopy,[31] and qualitatively by field emission scanning electron microscopy (FESEM), UV-vis-NIR spectroscopy, Raman spectroscopy, and transmission electron microscopy. The end result was a purified material that consistently contained at least 95% w/w single wall carbon nanotubes. Electron micrographs and thermo gravimetric analyses representative of the raw and purified SWNT materials are shown in FIG. 5. Composites of NAFION® and nanotube materials

RESULTS

The analysis of the actuation properties of the SWNT-NAFION® composite samples was accomplished utilizing a bimorph cantilever actuator apparatus.[14] First, the composite membranes were cut to appropriate size strips of 25 mm 4 mm 25 µm. To achieve a reproducible electrical contact to the membrane surface, the previously reported chemical reduction of platinum ions on the surface of the NAFION® membrane was utilized.[13],[6] Since high doping levels of metal ions can cause actuation in NAFION® membranes,[6] the platinization levels in this study were experimentally controlled to keep the platinum concentrations at 2-3% w/w, well below the doping levels (>30% w/w) necessary to cause independent NAFION® actuation.6 The thin films were then immobilized on the parallel sides of an insulating 5 mm 35 mm Kapton tape.

After sealing the electrical contacts, the assembled electrodes were immersed into an aqueous 1 M LiCl solution. Lithium ions were chosen as the electrolyte cation because of the enhanced permeability of NAFION® to the lithium as compared to other monovalent cations.[6] A square wave excitation voltage ranging from 0.1 to 2.0V was then applied to the electrodes with a stepping frequency from 1 to 50 Hz. The magnitude of actuation of the bimorph cantilever tip was determined with optical deflection analysis.[5] Pure SWNT, SWNT-NAFION®, platinized NAFION®, and platinized SWNT-NAFION®, as well as a series of control experiments with graphite-NAFION® composite membranes, were all evaluated for their actuation properties. In the control experiments that included pure NAFION®, platinized NAFION®, graphite-NAFION®, and platinized graphite-NAFION® membranes, no actuation was observed. In the case of the graphite-doped NAFION® systems, the maximum loading was the same as for the SWNT systems, 18% w/w. Another series of controls with various 5% w/w SWNT-polymer systems, prepared in a manner similar to that for the SWNT-NAFION® composites, consisted of polyacrylonitrile, polyvinylbutyral, Eastman AQ-55, AQ-29, poly(4-vinylpyridine), poly(2-acrylamido-2-methyl-propane sulfonic acid), and polystyreneblock-poly(ethylene-ran-butylene)-block-polystyrene-sulfonate were also evaluated for actuation properties. None of these 5% w/w SWNT-doped polymer composites exhibited actuation properties in the lithium electrolyte solutions, but that does not necessarily indicate that they won't actuate under other experimental conditions. So it is clear from the observation that actuation occurs only for the SWNT-NAFION® composites for which the increased conductivity necessary for the deformation of the polymer is caused by the efficient percolation of the nanotubes through the polymer matrix. It is also clear that it is possible to reach the actuation threshold at considerably lower doping levels when the SWNTs are used instead of metalization, 1% versus 30% w/w, respectively.

Figure 6:
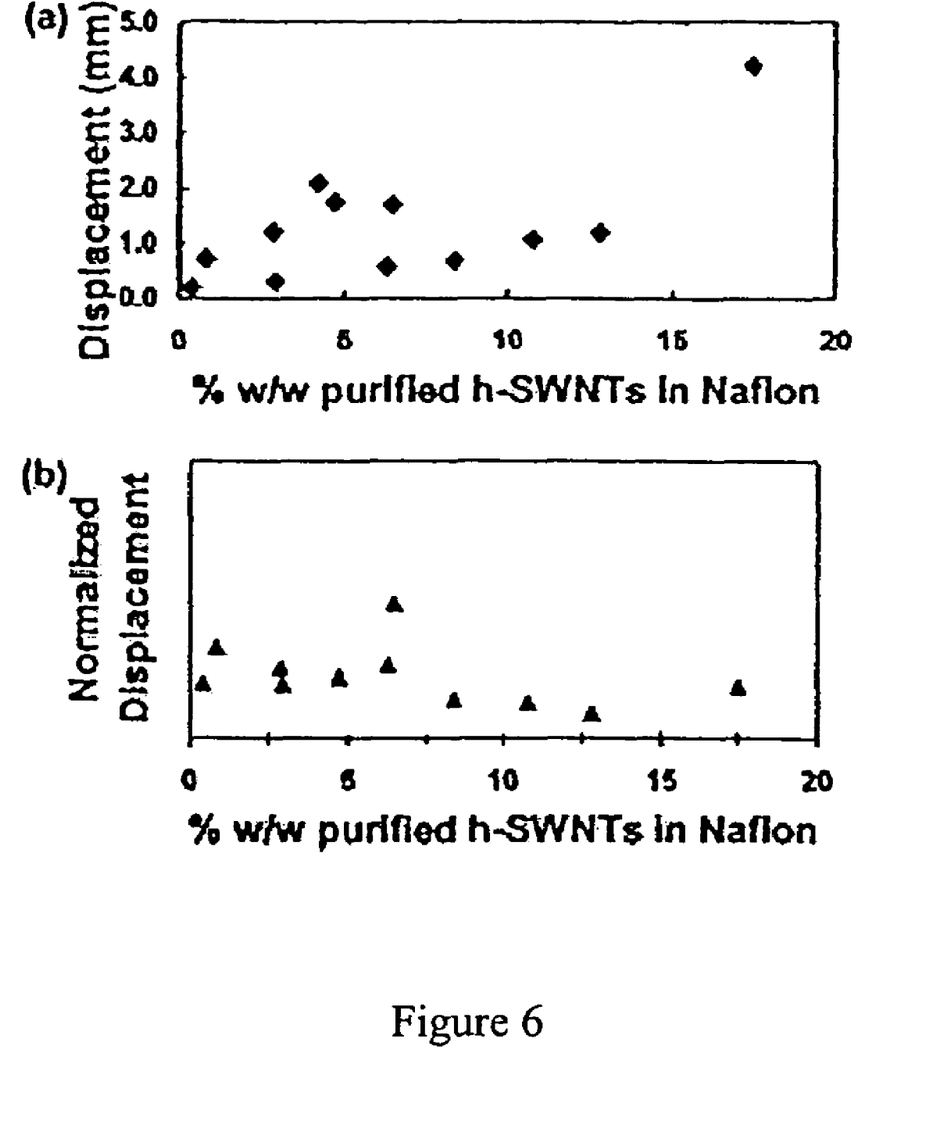
FIG. 6. Shows actuation properties of the platinized h-SWNT-Nafion composite series. The magnitude of actuation of the bimorph cantilever tip was determined with optical deflection analysis: (a) cantilever tip displacement observed from a square-wave excitation voltage of (2V at a frequency of 1 Hz, (b) the displacement data in (a) normalized to the respective composite conductivity.

The actuation response for this complete range of h-SWNT doped polymer composites is illustrated in FIG. 6a. For this series of h-SWNT weight percent doping levels, the deflection at the cantilever tip ranged from 0.2 to 4.5 mm for the 0.5-18% w/w composite at a (2.0 V bias, 1 Hz excitation, respectively. Unlike the current art of metaldoped polymers, no relaxation of the cantilever tip was observed for the SWNT-NAFION® composite actuators with SWNT doping levels greater than 1% W/W.[6] When the cantilever tip deflection data for the h-SWNT-NAFION® composite actuators was normalized to the composite membrane's conductivity, FIG. 6b, it can be seen that the actuation response of the membranes was directly dependent on the doping level of SWNTs and conductivity of the NAFION® matrix. As shown earlier, the electrical conductivity of SWNT-NAFION® composite membranes is related to the SWNT doping level. This behavior illustrates the efficient percolation ability of the high aspect ratio SWNTs, which results in the actuation of the composite membrane. Most importantly, with SWNT dopants, the amount of dopant necessary to achieve the electrical conductivity threshold for NAFION® actuation can be reached at extremely low weight percent levels as compared to metal dopings. Also, at the increased weight percent levels, the SWNTs dramatically enhance the membrane conductivities, corresponding to a markedly enhanced actuator deflection. Moreover, deflection values (1-2 mm) for the less than 5% w/w SWNT-NAFION® platinized composites are comparable to reported metal-doped, 30% w/w NAFION® actuators while the higher SWNT dopant level, 18% w/w, induces a significantly larger deflection, 4.5 mm.[6] FIG. 6. Actuation properties of the platinized h-SWNT-NAFION® composite series. The magnitude of actuation of the bimorph cantilever tip was determined with optical deflection analysis: (a) cantilever tip displacement observed from a square-wave excitation voltage of (2V at a frequency of 1 Hz, (b) the displacement data in (a) normalized to the respective composite conductivity.

For comparison, NAFION® composite membranes were also prepared using purified laser-generated single wall carbon nanotubes, 1-SWNTs. The material was produced and purified according to our previously reported procedures.[31],[28] The platinized 1-SWNT composite electrodes were constructed at 1 and 5% w/w doping. The membrane conductivities and cantilever tip deflections observed for these actuator systems were the same, within experimental error, as the measurements made of the platinized h-SWNT-NAFION® composites. To conclude, successful dispersion of high purity single wall carbon nanotubes (laser and HiPco) was achieved in the NAFION® polymer at doping levels between 0.1 and 18% w/w. Apparent interactions between the SWNTs and NAFION® matrix led to debundling of the purified SWNTs, enhancing dispersion of the tubes throughout the membrane. Due to the electrical conductivity of high aspect ratio SWNTs and the resulting efficient percolation pathways within the polymer composites, they exhibit superior performance as actuators when compared to metal-doped NAFION® films. These SWNT composites should enable the production of high performance microactuators used potentially as MEM switches or artificial muscle fibers.

ADDITIONAL RESULTS

Figure 7:
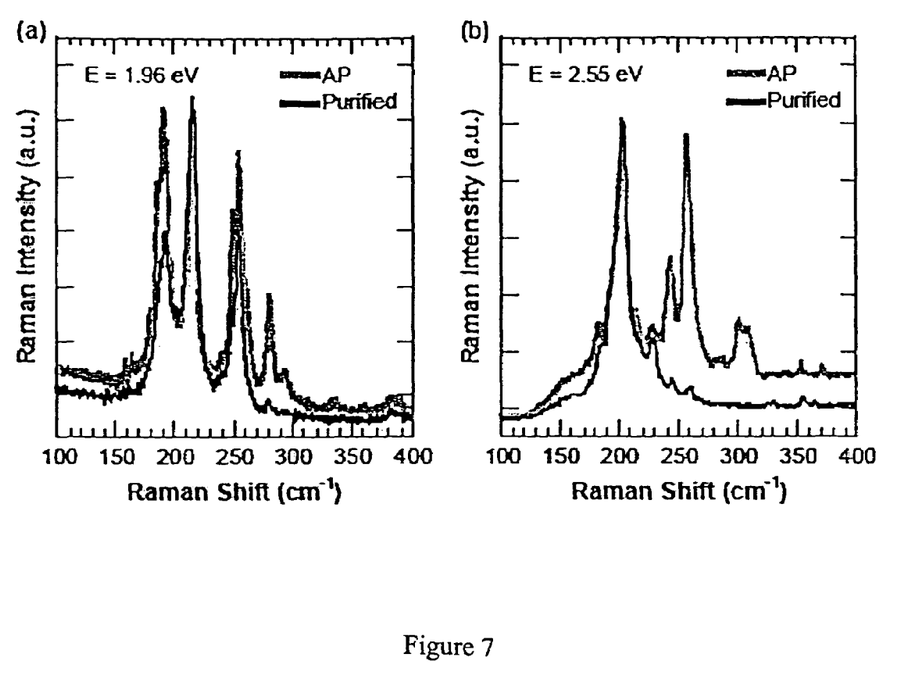
FIG. 7. Shown is the radial breathing mode (RBM) from the Raman spectra of AP (gray) and purified, >95% w/w h-SWNTs (black), for incident laser energies of (a) 1.96 eV and (b) 2.55 eV.

The purity of the SWNTs prior to dispersion in the NAFION® matrix is an important consideration during composite preparation, as the purity will directly affecting conductive percolation limits based upon dopant mass. Therefore, it is suggested that to attain the "best" actuation, high purity, >95% w/w NTs. As seen in FIG. 3 SEM images representative of the (a) AP h-SWNTS, and (b) purified, >95% w/w h-SWNTs, display significant removal of the amorphous carbon coatings from the purification process. In addition to this qualitative analysis, we have shown using TGA that the iron catalyst impurities can be reduced to <3% w/w. Raman spectroscopy was performed to determine any changes in the diameter distributions of AP h-SWNTs during the purification process. Shown in FIG. 7 is the Raman data for AP h-SWNTs (gray) and purified, >95% w/w h-SWNTs (black). The data in (7a) and (7b) represents the radial breathing modes (RBM) for laser energies of 1.96 and 2.55 eV, respectively. This spectral region directly relates to the diameter distribution and type (metallic or semiconducting) of SWNTs.$_{(33,34)}$ T For both (7a) and (7b), the Raman shifts for AP h-SWNTs occur between 180-320 cm−1 indicating diameters corresponding to 0.73-1.35 nm and the presence of both metallic and semiconducting SWNTs. The purified h-SWNTs have a diameter range of ~1.0-1.3 nm containing both metallic peaks (at 190, 216, and 253 cm−1 in 3a) and semiconducting peaks (at 199 and 223 cm−1 in 3b).

Figure 8:
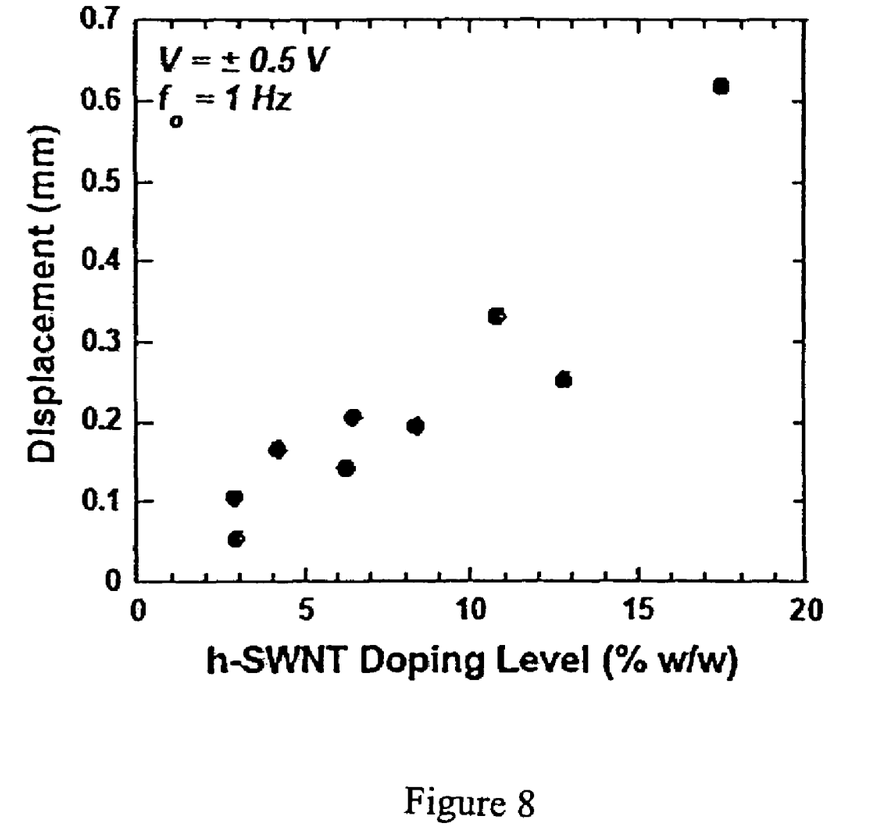
FIG. 8. Illustrates bimorph cantilever tip displacement data for varying percent by weight h-SWNT-Nafion composite actuators at an applied voltage of ±0.5 V and an operating frequency of 1 Hz.
Figure 9:
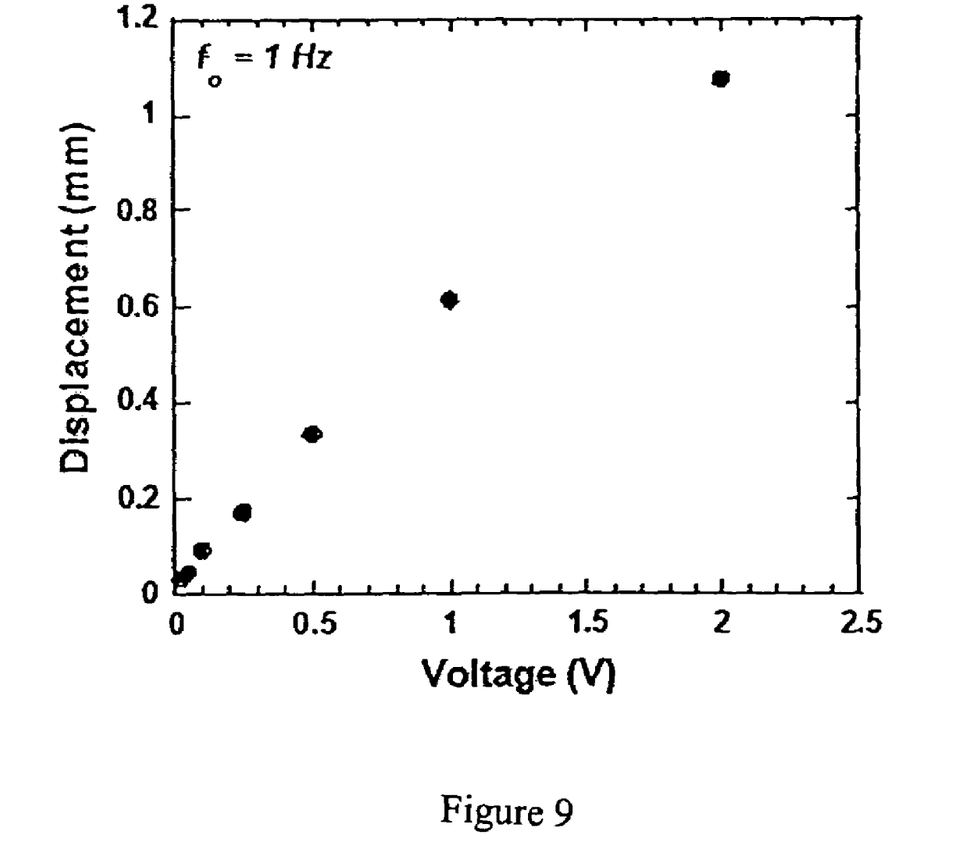
FIG. 9. Illustrates bimorph cantilever tip displacement data for a 10.8% w/w h-SWNT-Nafion composite actuator as a function of voltage at an operating frequency of 1 Hz. The plot shows the linear dependence of applied voltage on tip displacement.

Preparation of the SWNT-NAFION® composite solutions was performed as previously reported at various percent by weight SWNT doping levels.$_{(32)}$ The characteristic relationship of displacement as a function of doping level for SWNT-NAFION® composite actuators is shown in FIG. 8 or an applied voltage of ±0.5 V and an operating frequency of 1 Hz, the resulting displacement is observed to increase as the percent by weight SWNTs is increased. These results, at relatively low voltages, offer tip displacements that are approaching reported values for metallized NAFION® actuators, ~1 mm.$_{(6)}$ The actuator tip deflection for metallized NAFION® actuators has been shown to be dramatically improved by altering the applied voltage.$_{(12)}$ Similarly, for a 10.8% w/w SWNT-NAFION® composite actuator, the effects of a varying sinusoidal voltage on displacement at a constant frequency of 1 Hz were also measured from 0.025 to 2.0 V. As seen in FIG. 9, SWNT-NAFION® actuators exhibit a linear dependence of tip displacement by voltage. This compares to the reported behavior of platinum-NAFION® actuators where an "almost proportional" relationship between displacement and voltage was observed.$_{(13)}$ Therefore, the results indicate that variation in the potential difference between electrodes can impact the flux of solvated cations. (As described earlier, a higher degree of solvated cation diffusion into the composite electrodes will induce a larger degree of differential swelling and corresponding bending of the tip.$_{(6)}$ This applied voltage effect offers the potential for controlled manipulation of tip displacements for SWNT-NAFION® composite actuators.

Characterization of the bimorph cantilever actuator tip displacement as a function of operating frequency was conducted at constant voltage. Analysis of the frequency effects on displacement for representative doping levels (6.3, 10.8, and 17.5% w/w SWNTs) is displayed in FIG. 10.

Figure 10:
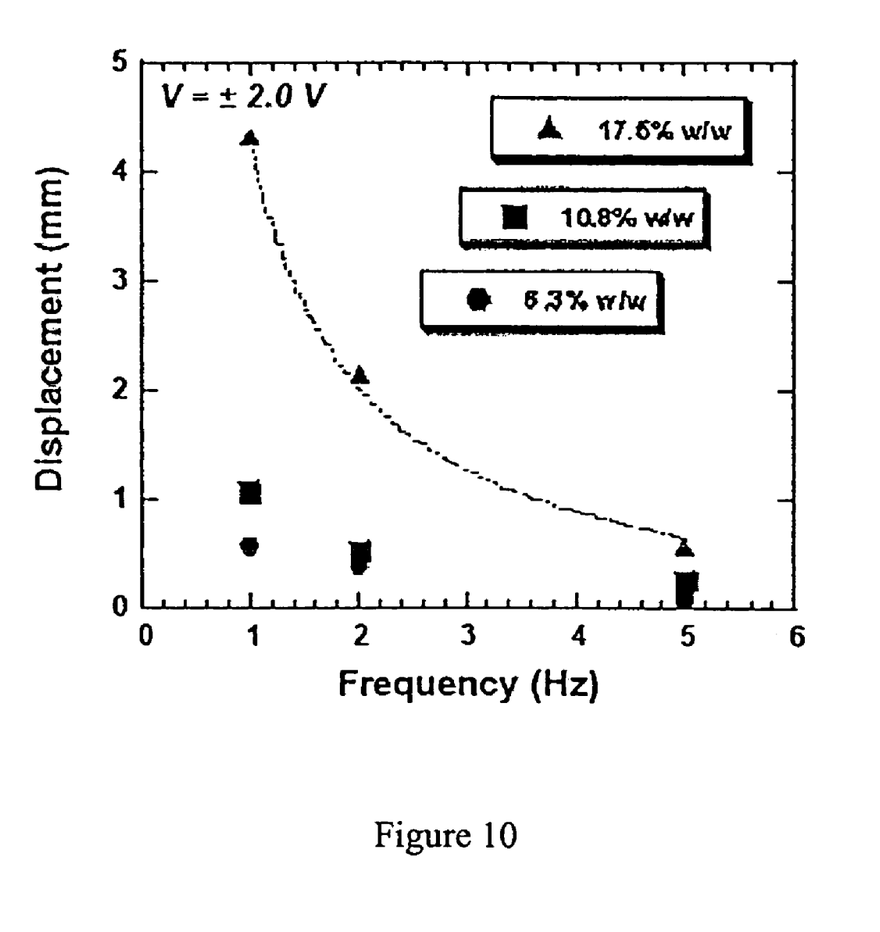
FIG. 10. Illustrates bimorph cantilever tip displacement (d) data for 6.3, 10.8, and 17.5% w/w h-SWNTNafion composite actuators at an applied voltage of ±2.0 V as a function of the operating frequency (f). The dashed curve represents the relationship, $d=1/f$.

There is an observed reduction in displacement for each doping level as frequency increases. Also, characteristic of each doping level is an inverse relationship between displacement and frequency. The dashed line in FIG. 10 represents displacement as a 1/frequency relationship, similar to the data points for the 17.5% w/w composite. Although not depicted in FIG. 10, this functional form holds true for the other doping levels as well. As expected, the response time of the actuator is limited by the frequency at which the potential bias is alternated. Previous data by others also show decreasing displacement results for metallized-NAFION® actuators.$_{(35)}$ However, there may exist other contributing factors for SWNT-NAFION® composite actuators which effect tip displacement as a function of frequency. At low frequencies there are potentially mechanical restrictions inherent to the SWNT-NAFION® electrodes and insulating polyimide substrate which prevent complete displacement during the applied stimulation. In our case, application of the SWNT-NAFION® composite electrodes on the insulating polyimide substrate was intended to eliminate reported "curling" effects of metallized-NAFION® actuators by isolating the electrodes to a flexible support. For high frequencies, it is proposed that cation diffusion would be the limiting factor responsible for an observable maximum frequency. In the series of SWNT-NAFION® composites analyzed, the highest frequency observed using the optical analysis station was 50 Hz at ±2.0 V for the 17.5% w/w composite.

In alternate embodiment of the invention the actuator comprises one electrode and an electrolyte, the electrode being comprised of a nanostructured material, preferably comprised of: carbon nanotube and more preferably comprised of SWNTs.

Having described the basic concept of the invention, it will be apparent to those skilled in the art that the foregoing detailed disclosure is intended to be presented by way of example only, and is not limiting. Various alterations, improvements, and modifications are intended to be suggested and are within the scope and spirit of the present invention. Additionally, the recited order of the elements or sequences, or the use of numbers, letters or other designations therefore, is not intended to limit the claimed processes to any order except as may be specified in the claims. Accordingly, the invention is limited only by the following claims and equivalents thereto.

REFERENCES (1) Che, G., Miller, S. A., Fisher, E. R., Martin, C. R. *Anal. Chem.* 1999, 71, 3187-3191.
(2) Baughman, R. *Synth. Met.* 1996, 78, 339-353.
(3) Bay, L., Jacobsen, T., Skaarup, S., West, K. *J. Phys. Chem. B* 2001, 105, 8492-8497.
(4) Sonoda, Y., Takashima, W., Kaneto, K. *Synth. Met.* 2001, 119, 267-268.
(5) Baughman, R.; Cui, C.; Zakhidov, A. A.; Iqbal, Z. B., J. N.; Spinks, G. M.; Wallace, G. G.; Mazzoldi, A.; De Rossi, D.; Rinzler, A. G.; Jaschinski, O.; Roth, S.; Kertesz, M. *Science* 1999, 284, 1340-1344.
(6) Abe, Y., Mochizuki, A.; Kawashima, T.; Yamashita, S.; Asaka, K.; Oguro, K. *Polym. Adv. Technol.* 1998, 9, 520-526.
(7) Shahinpoor, M. In *Proc. SPIE: Smart Materials*; Wilson, A. R. A., H., Ed., 2001; Vol. 4234, pp 203-214.
(8) Schreyer, H. B., Gebhart, N., Kim, K. J., Shahinpoor, M. *Biomacromolecules* 2000, 1, 642-647.
(9) Irvin, D. J., Goods, S. H., Whinnery, L. L. *Chem. Mater.* 2001, 13, 1143-1145.
(10) Eisenberg, A., Yeager, H. L. *Perfluorinated Ionomer Membranes*; American Chemical Society: Washington, D.C., 1982.
(11) Kim, K. J., Shahinpoor, M. *Polymer* 2002, 43, 797-802.
(12) Noh, T. G., Tak, Y., Nam, J. D., Choi, H. *Electrochimica Acta* 2002, 00, 1-6.
(13) Fujiwara, N., Asaka, K., Nishimura, Y., Oguro, K., Torikai, E. *Chem. Mater.* 2000, 12, 1750-1754.
(14) Onishi, K., Sewa, S., Asaka, K., Fujiwara, N., Oguro, K. *Electrochimica Acta* 2001, 46, 1233-1241.
(15) Uchida, M., Taya, M. *Polymer* 2001, 42, 9281-9285.
(16) Asaka, K., Fujiwara, N., Oguro, K., Onishi, K., Sewa, S. *J. Electroanal. Chem.* 2001, 505, 24-32.
(17) Spinks, G. M., Wallace, G. G., Fifield, L. S., Dalton, L. R., Mazzoldi, A., De Rossi, D., Khayrullin, I. I., Baughman, R. H. In *Mat. Res. Soc. Symp. Proc.,* 2002; Vol. 706.
(18) Fraysse, J., Minett, A. I., Gu, G., Roth, S., Rinzler, A. G., Baughman, R. H. *Curr. Appl. Phys.* 2001, 1, 407-411.
(19) Minett, A., Fraysse, J., Gang, G., Kim, G. T., Roth, S. *Curr. Appl. Phys.* 2002, 2, 61-64.
(20) Biercuk, M. J., Llaguno, M. C., Radosavljevic, M., Hyun, J. K., Johnson, A. T., Fischer, J. E. *Appl. Phys. Lett.* 2002, 80, 2767-2769.
(21) Qian, D., Dickey, E. C., Andrews, R. Rantell, T. *Appl. Phys. Lett.* 2000, 76, 2868-2870.
(22) Lau, K. *Carbon* 2002, 1.
(23) Ajayan, P. M., Schadler, L. S. *Adv. Mater.* 2000, 12, 750-753.
(24) Gong, X., Liu, J., Baskaran, S., Voise, R. D., Young, J. S. *Chem. Mater.* 2000, 12, 1049-1052.
(25) Wei, C., Srivastava, D., Cho, K. *Nanoletters* 2002, in press.
(26) Liao, K., Li, S. *Appl. Phys. Lett.* 2001, 79, 4225-4227.
(27) de Heer, W. A., Bacsa, W. S., Chatelain, A., Gerfin, T., Humphrey-Baker, R., Forro, L., Ugarte, D. *Science* 1195, 268, 845-847.
(28) Gennett, T.; Dillon, A. C.; Alleman, J. L.; Jones, K. M.; Hasoon, F. S.; Heben, M. J. *Chem. Mater.* 2000, 12, 599-601.
(29) Wallace, J. M. M. S. Thesis; Rochester Institute of Technology: Rochester, N.Y., 1994; pp 32-33.
(30) Chiang, I. W.; Brinson, B. E.; Smalley, R. E.; Margrave, L.; Hauge, R. H. *J. Phys. Chem. B* 2001, 105, 1157-1161.
(31) Dillon, A. C.; Gennett, T.; Jones, K. M.; Alleman, J. L.; Parilla, P. A.; Heben, M. J. *Adv. Mater.* 1999, 11, 1354-1358.
(32) Landi, B. J.; Raffaelle, R. P.; Heben, M. J.; Alleman, J. L.; VanDerveer, W.; Gennett, T. *Nano Lett.* 2002, 2, 1329.
(33) Dresselhaus, M. S.; Dresselhaus, G.; Jorio, A.; Souza Filh A. G.; Saito, R. *Carbon* 2002, 40, 2043.
(34) Alvarez, L.; Righi, A.; Guillard, T.; Rols, S.; Anglaret, E.; Laplaze, D.; Sauvajol, J. L. *Chem. Phys. Lett.* 2000, 316, 186.
(35) Jung, K.; Nam, J.; Choi, H. *Sens. Actuators A* 2003, in press.

We claim the following:

1. An actuator comprising:
   at least one electrolyte;
   at least two electric conducting electrodes separated by said at least one electrolyte;
   at least one electrode of said electric conducting electrodes providing an electromechanical response upon application of an electronic voltage between said at least two electric conducting electrodes; and
   at least one electrode of said electric conducting electrodes comprising a carbon nanotube-polymer composite doped with a metal.

2. The actuator of claim 1, wherein 0.1-18 weight percent of the carbon nanotube-polymer composite is single wall carbon nanotubes.

3. The actuator of claim 1, wherein the carbon-nanotube composite is prepared by polymer processing material techniques.

4. The actuator of claim 1, wherein the electrolyte is selected from the group consisting of: monovalent metal ions, polyvalent metal ions and combinations thereof.

5. The actuator of claim 1, wherein the carbon nanotube-polymer composite is produced by a technique selected from the group consisting of: melt polymerization, extrusion, and solution casting.

6. An actuator comprising:
   at least one electrolyte;
   at least two electric conducting electrodes separated by said at least one electrolyte;
   at least one electrode of said electric conducting electrodes providing an electromechanical response upon application of an electronic voltage between said at least two electric conducting electrodes; and
   at least one electrode of said electric conducting electrodes comprising a carbon nanotube-polymer composite doped with a metal,
   wherein the carbon nanotube-polymer composite is prepared by the following method:
   preparing a carbon nanotube-polymer solution;
   casting the carbon nanotube-polymer solution, forming a carbon nanotube-polymer composite;
   drying the carbon nanotube-polymer composite;
   doping the carbon nanotube-polymer composite with a metal.

7. The actuator of claim 6, wherein the nanotube polymer solution is prepared by mixing: a polymer, carbon nanotubes and a liquid, wherein the polymer is soluble or dispersible in the liquid.

8. The actuator of claim 7, wherein the carbon nano-tubes are single wall carbon nanotubes.

9. The actuator of claim 7, wherein the polymer is selected from the group consisting of: ionomers, polyelectrolytes, ionic polymers, ionically doped polymers, and combinations thereof.

10. The actuator of claim 7, wherein the polymer is a perfluorinated ionomeric polymer.

11. The actuator of claim 7, wherein the liquid is an alcohol.

12. The actuator of claim 7, wherein the polymer is a smart gel.

13. The actuator of claim 6, wherein the process further comprising: high shear stirring the carbon nanotube-polymer solution before casting.

14. The actuator of claim 6, wherein the process further comprising: homogenizing the carbon nanotube-polymer solution before casting.

15. The actuator of claim 6, wherein the process further comprising: centrifuging the carbon nano-tube polymer solution before casting.

16. The actuator of claim 6, wherein the metal is selected from the group consisting of: platinum, gold, copper and combinations thereof.

17. The actuator of claim 6, where the carbon nanotube is a multi wall nanotube, a nanohorn or other fibrous carbon nanostructured material.

18. The actuator of claim 6, wherein the actuator is capable of operating in aqueous, non-aqueous, gel, or solution free environments.

19. The actuator of claim 6, wherein the electromechanical response includes an osmotic mechanism.

20. The actuator of claim 6, further comprising a surfactant applied to the actuator.

21. The actuator of claim 6, wherein at least one electrode is ceramic.

* * * * *